United States Patent [19]

Bergdahl et al.

[11] Patent Number: 4,939,486
[45] Date of Patent: Jul. 3, 1990

[54] FILTER EQUIPMENT FOR POWER LINES

[75] Inventors: Bernt Bergdahl; Jan T. Holmgren, both of Ludvika, Sweden

[73] Assignee: Asea Brown Boveri AB, Västerås, Sweden

[21] Appl. No.: 293,777

[22] Filed: Jan. 4, 1989

[30] Foreign Application Priority Data

Jan. 4, 1988 [SE] Sweden ................................. 8800006

[51] Int. Cl.$^5$ ...................... H03H 7/01; H02M 1/12
[52] U.S. Cl. .................... 333/175; 333/167; 307/105; 363/45
[58] Field of Search ............... 333/167, 175, 176, 181, 333/185, 234; 363/35, 39, 40, 45, 46, 47; 307/105

[56] References Cited

U.S. PATENT DOCUMENTS 4,728,907  3/1988  Cohen ............................. 331/96 X
4,743,873  5/1988  Schultz et al. .................. 333/167 X

FOREIGN PATENT DOCUMENTS

A20140462  5/1985  European Pat. Off. .
A784930    7/1935  France .
A245815   11/1946  Switzerland .
A507596    6/1939  United Kingdom .
A598817    2/1948  United Kingdom .
A639509    6/1950  United Kingdom .
A720514   12/1954  United Kingdom .
A781653    8/1957  United Kingdom .
A798735    7/1958  United Kingdom .

*Primary Examiner*—Eugene R. LaRoche
*Assistant Examiner*—Seung Ham
*Attorney, Agent, or Firm*—Pollock, Vande Sande & Priddy

[57] ABSTRACT

Filter equipment for power lines has a double-tuned shunt filter (F1) which has a series resonance circuit (C1, L1) connected in series with a parallel resonance circuit (C2, L2). The capacitor banks of the two resonance circuits are formed so as to have opposite signs on the temperature coefficient of the capacitor capacitance.

19 Claims, 1 Drawing Sheet

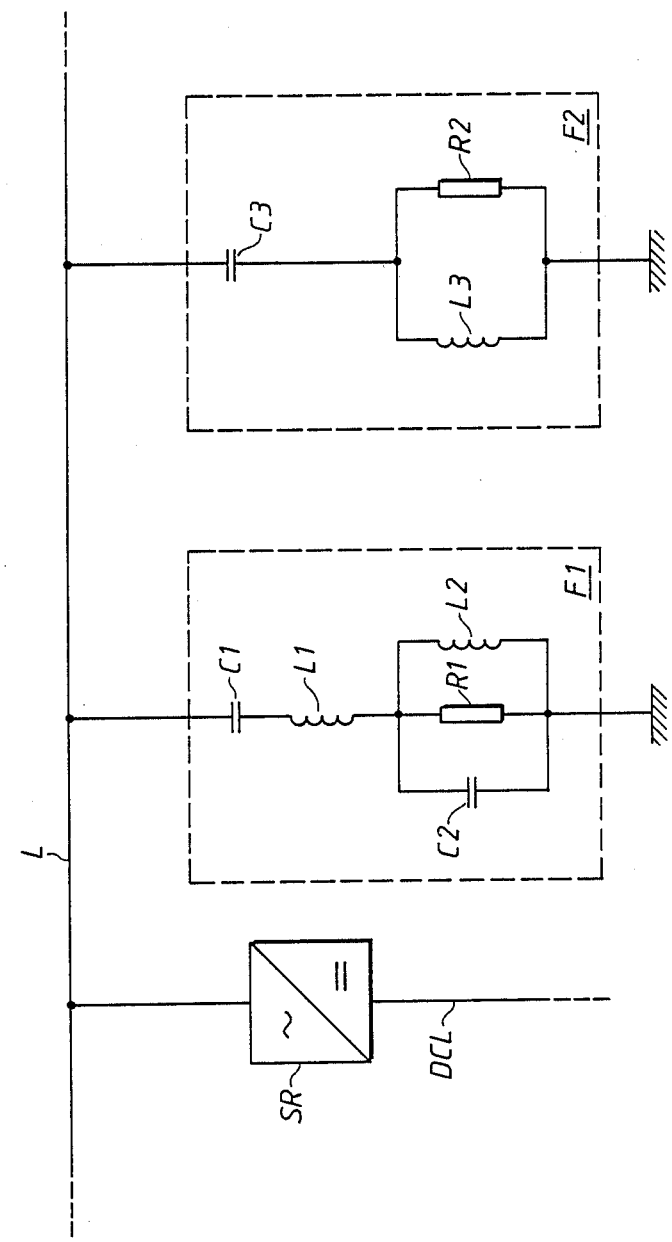

FILTER EQUIPMENT FOR POWER LINES

TECHNICAL FIELD

The present invention relates to filter equipment for power lines with a double-tuned shunt filter which has a series resonance circuit with a first capacitor bank and a first inductor and a parallel resonance circuit with a second capacitor bank and a second inductor.

BACKGROUND ART

Certain types of equipment, connected to an a.c. network, generate harmonic currents. These currents may cause considerable drawbacks, for example in the form of interference in telecommunications or signal lines and increased losses in other types of equipment connected to the same a.c. network. A typical example of a type of equipment which generates harmonic currents is a convertor, for example of the type which is used in plants for power transmission with the aid of high voltage direct current. Such a convertor generates a set of harmonic currents with the frequencies $$fn1 = (n.p+1)f0 \text{ and } fn2 = (n.p-1)f0$$

where
  n is 1, 2, etc.
  p is the pulse number of the convertor, and
  f0 is the fundamental frequency of the network.

A six-pulse convertor thus generates current harmonics of the ordinal numbers 5, 7, 11, 13, etc., and a twelve-pulse convertor generates harmonics of the ordinal numbers 11, 13, 23, 25, etc.

In connection with equipment for power transmission by means of high voltage direct current, it has long been well-known to connect filter equipment to the a.c. networks concerned in order to reduce the effect of the current harmonics. In typical cases, shunt filters have been used which are tuned to the lower order harmonics and possilbly, in addition, a high-pass filter which takes care of the higher order harmonics. Such filters are known, for example, from Adamson, Hingorani: "High Voltage Direct Current Power Transmission", London 1960, pp. 168-170, Adamson et al: "High Voltage Direct Current Converters & Systems", London 1965, pp. 147-162, and Uhlmann: "Power Transmission by Direct Current", Berlin-Heidelberg-New York 1975, pp. 361-376.

From the above cited Adamson et al: "High Voltage Direct Current Converters & Systems", London 1965, pp. 148, 149, 154, 155, so-called double-tuned shunt filters are previously known in this connection. Such a filter has two resonance frequencies and is normally tuned to a pair of adjacent harmonics, for example those of the ordinal numbers 5 and 7 or 11 and 13. Such a filter has the same effect as two single-tuned filters but may give economical advantages in the form of a lower installed capacitor power, lower voltage stresses on the inductors and lower power losses.

When dimensioning filters of the above-mentioned known type, the temperature dependence of the filter components must be taken into consideration. This is particularly true of the capacitances of the filter capacitors, the temperature dependence of which completely predominates over the temperature dependence of the inductances. Filter equipment of this kind is normally erected in the open and is therefore subjected to great temperature variations. The maximum relative capacitance change may typically be ±2%, which capacitance change gives a variation of the tuning frequency of the filter of ±1%. Thus, a correct tuning of the filter at a certain temperature results in a detuned filter at other temperatures. To give the filter a sufficient band width to take care of these changes in the tuning frequency of the filter, it has hitherto been necessary to design filters of this kind with a lower factor of merit than what would otherwise have been necessary. This, in turn, means that filters used up to now have had a relatively high impedance at the resonance frequency, and therefore it has been necessary to give the filters large dimensions (a high installed reactive power) to arrive at the low impedance necessary for an efficient attenuation of harmonics.

In order to avoid the drawbacks mentioned, it is known to design filters of this kind to be self-tuning. In such a filter, the inductance of the filter inductor is controllable by means of a servo motor. The motor is controlled continuously in such a way that the filter is always correctly tuned independently of temperature variations (and of variations in the mains frequency). However, it has proved that a self-tuning filter is complicated, requires a great deal of maintenance and has a poor reliability. Therefore, filters of this kind have not been used to any greater extent.

From EP-A No. 2 0 140 462, it is previously known, in circuits for filtering of electronic signals, to divide each one of the capacitors of the filter into two sub-capacitors having different signs of the temperature coefficient of the capacitance. In this way, the temperature dependence of each such capacitor, assembled from two sub-capacitors, may be reduced. From GB-A No. 720 514, it is previously known to reduce the temperature dependence of a capacitor by building an auxiliary capacitor into the capacitor, the temperature coefficient of this auxiliary capacitor having a sign opposite to that of the temperature coefficient of the main capacitor. From GB-A No. 781 763, it is previously known to reduce the temperature dependence of a capacitor by using two different dielectric materials in the capacitor.

Filter equipment of the kind referred to here typically has very large dimensions, and dividing each capacitor into two sub-capacitors, or specially constructing each capacitor with an auxiliary capacitor or with two different dielectrics, would entail considerable drawbacks, for example in the form of a considerable increase of the cost of the equipment.

SUMMARY OF THE INVENTION

The invention aims to provide filter equipment of the kind mentioned in the introduction, in which, in a simple manner and without need of movable parts or special control systems, the effect of the temperature variations on the tuning frequencies of the filters is greatly reduced.

The invention further aims to bring about the above-mentioned reduction of the effect of the temperature vartiations in such a way that the capacitor banks included in the filter equipment can be optimized, in total terms, with respect to, for example, price, function and space requirement.

This means that the bandwidth of a filter can be reduced by increasing the factor of merit of the filter and hence decreasing the impedance of the filter. This enables a considerable reduction of the power ratings of the components of the filter equipment and hence a considerable reduction of the price and the space requirement of the filter equipment.

If, instead, the factor of merit of the filter is maintained unchanged, a filter according to the invention will work with a smaller phase angle than filters of previously used kind. In this way, the current amplification is reduced in those cases where a network impedance gets into parallel resonance with the filter. This, in turn, results in a reduction of the stresses on the components of the filter.

What characterizes filter equipment according to the invention will be clear from the accompanying claims.

BRIEF DESCRIPTION OF THE DRAWING

The invention will be described in greater detail with reference to the accompanying drawing, the single figure of which shows an example of filter equipment according to the invention.

DESCRIPTION OF THE PREFERRED EMBODIMENTS

The figure shows in the form of a single-line diagram a three-phase a.c. power line L, a convertor SR connected thereto, and filter equipment according to the invention comprising a shunt filter F1 and a high-pass filter F2. The convertor SR may be a convertor in a plant for power transmission by means of high voltage direct current and is then, as is shown in the figure, connected on its d.c. side to a d.c. power line DCL. In the following, the convertor is assumed to have the pulse number 12.

The filter F1 is a double-tuned shunt filter, which is tuned to the two harmonics of the ordinal numbers 11 and 13, which are the lowest ordinal numbers of the current harmonics generated by the convertor. In a known manner, the filter comprises a series resonance circuit, which is connected in series with a parallel resonance circuit. The series resonance circuit comprises a capacitor bank C1 and an inductor L1. The parallel resonance circuit comprises a capacitor bank C2 and an inductor L2. The filter also comprises a filter resistor R1 to give the filter the desired factor of merit. The filter is connected between the power line, the filter equipment comprises two additional shunt circuits (not shown), i.e. in total three such circuits. These may either be star-connected (one filter circuit between each phase conductor and ground) or triangle-connected (one filter circuit between each pair of phase conductors).

Filter equipment of this kind generally has very large dimensions and, for example, the capacitor bank C1 may have a rated power of 5 MVAr and the capactior bank C2 a rated power of 5 MVAr.

The inductors L1 and L2 consist of iron-less air inductors.

According to the invention, the two capacitor banks C1 and C2 are now designed such that the temperature coefficients of their capacitances will have opposite signs. The capacitor bank C1 must be dimensioned so that it can absorb the line voltage at the fundamental tone frequency. This capacitor bank is therefore relatively large and expensive and must be optimized for low losses. It has been found to be suitable to design this capacitor bank as a bank of plastic film capacitors, i.e. capacitors whose dielectric consists of a plastic film. The capacitor C1 will then have a negative temperature coefficient, i.e. its capacitance decreases as the temperature rises.

The capacitor bank C2 may then suitably consist of a bank of capacitor units, the dielectric of which consists of mineral oil impregnated paper. Such capcitors have a positive temperature coefficient, i.e. their capacitance increases with increasing temperature.

As mentioned above, a double-tuned filter of the current kind has two resonance frequencies f1 and f2, i.e. the impedance of the filter exhibits minimums at these two frequencies. Normally, a filter of this kind is dimensioned such that the series resonance circuit and the parallel resonance circuit have the same resonance frequency. This frequency becomes the geometric mean value of the frequencies f1 and f2 and is determined by the product $L1.C1 = L2.C2$. On this assumption, it can be shown that the capacitance dependence of the two resonance frequencies of the filter can be expressed by the following two relationships (which are valid for small capacitance changes):

$$\frac{\Delta f1}{f1} = -\frac{f2}{2(f1+f2)} \cdot \frac{\Delta C1}{C1} - \frac{f1}{2(f1+f2)} \cdot \frac{\Delta C2}{C2}$$

$$\frac{\Delta f2}{f2} = -\frac{f1}{2(f1+f2)} \cdot \frac{\Delta C1}{C1} - \frac{f2}{2(f1+f2)} \cdot \frac{\Delta C2}{C2}$$

where $$\frac{\Delta C1}{C1}$$

is the relative change in the capacitance of the capcitor C1 and $$\frac{\Delta C2}{C2}$$

is the relative change in the capacitance of the capacitor C2. The frequencies f1 and f2 normally lie relatively close to each other, and the coefficients in front of $$\frac{\Delta C1}{C1}$$

and $$\frac{\Delta C2}{C2}$$

in the above two expressions are therefore approximately equal. According to the invention, the capacitors are so chosen that the quantities $$\frac{\Delta C1}{C1}$$

and $$\frac{\Delta C2}{C2}$$

have opposite signs. Provided that these two quantities have approximately the same value, therefore, a good—and often very good—compensation of the effect of the temperature on the tuning frequencies of the filter can be obtained in this way.

For the filter equipment shown in the figure, which is assumed to be tuned to the harmonics of the ordinal numbers 11 and 13, the following is obtained from the above two expressions:

$$\frac{\Delta f1}{f1} = -\frac{13}{48} \cdot \frac{\Delta C1}{C1} - \frac{11}{48} \cdot \frac{\Delta C2}{C2}$$

$$\frac{\Delta f2}{f2} = -\frac{11}{48} \cdot \frac{\Delta C1}{C1} - \frac{13}{48} \cdot \frac{\Delta C2}{C2}$$

As will be clear from these expressions, if $$\frac{\Delta C1}{C1}$$

has the same value as but a sign opposite to that of, $$\frac{\Delta C2}{C2}$$

a very good compensation can be obtained of the effect of the temperature variations on the tuning of the filter.

It is self-evident that the temperature coefficients of the two capacitor banks cannot be selected freely. In practice, however, it has proved possible to obtain a very considerable reduction of the temperature dependence of the tuning frequencies compared with prior art filters.

The great value of the invention from an economical-practical point of view will be clear from the following comparison between a filter of the previously known kind and a filter according to the invention. The filter is assumed to be tuned to the harmonics of the ordinal numbers 11 and 13.

In a typical filter of the prior art kind, the two capacitor banks C1 and C2 consist of plastic film capacitors. A typical such capacitor has the temperature coefficient $-4\%/100°$ C. The working temperature of the capacitors is assumed to vary within the range $-40°$ C. to $+30°$ C. What is obtained is then $$\frac{\Delta C1}{C1} = \frac{\Delta C2}{C2} = -\frac{70}{100} \cdot 4 = -2.8\%$$

When determining the bandwidth of the filter, any variations of the frequency of the network must also be taken into consideration. These variations may be assumed to lie within ±0.2%. The total relative change of the resonance frequencies of the filter over the whole temperature range, including the mains frequency deviations, will then be $$\frac{\Delta f1}{f1} = \frac{\Delta f2}{f2} = \frac{1}{2} \cdot 2.8 + 2 \cdot 0.2 = 1.8\%$$

A reasonable factor of merit of the filter is then $$\frac{1}{0.018} = 55$$

In a corresponding filter according to the invention, the following temperature coefficients can be assumed:
C1: $-4\%/100°$ C.
c2: $+1\%/100°$ C.
and the same temperature range as above. The following relations are then obtained $$\frac{\Delta C1}{C1} = -\frac{70}{100} \cdot 4 = -2.8\%$$

-continued $$\frac{\Delta C2}{C2} = \frac{70}{100} \cdot 1 = +0.7\%$$

The maximum mains frequency variation is assumed, as above, to be ±0.2%. The total relative change of the two resonance frequencies of the filter will then be $$\frac{\Delta f1}{f1} = \frac{13}{48} \cdot 2.8 - \frac{11}{48} \cdot 0.7 + 0.4 = 1.00\%$$

$$\frac{\Delta f2}{f2} = \frac{11}{48} \cdot 2.8 - \frac{13}{48} \cdot 0.7 + 0.4 = 0.85\%$$

Under the same assumptions as above, a reasonable factor of merit of the filter is then obtained $$\frac{1}{1.01} = 100$$

The temperature-compensated filter according to the invention can thus be made $$\frac{100}{55}$$

=1.8 times smaller than the prior art filter and still receive an equally low impedance for the resonance frequencies over the whole temperature range.

For attenuation of current harmonics of higher ordinal numbers than those to which the filer F1 is tuned, the equipment according to the invention also comprises a high-pass filter F2. In a manner known per se, this consists of a capacitor bank C3 in series with an inductor L3 and a filter resistor R2 connected in parallel with the inductor.

The embodiment of filter equipment according to the invention, shown in the figure, is only an example and a large number of other embodiments are feasible within the scope of the invention. Thus, the expressions, stated in the introductory part of the description, concerning the ordinal numbers of those current harmonics which are generated by convertors having different pulse numbers are only valid for ideal convertors. In practice, therefore, a convertor also generates other harmonics, in addition to the harmonics stated by these expressions, and depending on the circumstances it may then be suitable or necessary to arrange shunt filters for certain of these harmonics. Thus, for example, the third harmonic may occur, in which case it may be suitable to arrange a double-tuned filter for attenuation of the harmonics of the ordinal numbers 3 and 5.

In the example described above, it has been assumed that the current harmonics are generated by a convertor in a plant for transmission of power by means of high voltage direct current. The current harmonics are, of course, also generated by convertors used for other purposes, for example convertors for motor operation or for static reactive power compensation. Current harmonics can also be generated by other types of equipment, connected to a network, than convertors.

By the expression "power line", as used in this application, is meant a line or a conductor for transmission of electric power over larger or smaller distances. The obvious typical example of such a power line is a three-phase electric transmission or distribution line. However, this expression also comprises single-phase a.c. power transmission lines. It also comprises a d.c. power line, for example of the type which connects the convertor stations in a plant for power transmission by means of high voltage direct current.

The filter equipment described above only comprises one double-tuned shunt filter (F1). Depending on the circumstances, however, equipment according to the invention may also comprise a plurality of shunt filters, tuned to the same frequencies or to different frequencies. In those cases where filter equipment comprises a plurality of filters tuned to the same frequencies, these may suitably be designed to be connected or disconnected according to need. The high-pass filter F2 may be omitted or be formed in other ways than what has been described above.

The embodiment of a double-tuned filter described above is, of course, only an example and other embodiments of double-tuned filters can be used within the scope of the invention. Thus, for example, the sequence of the three units C1, L1, and the parallel resonance circuit C2-R1-L2, connected in series with each other, is arbitrary, and the capacitor bank C1 may, for example, as an alternative, be arranged next to ground, the inductor L1 next to the power line L and the parallel resonance circuit between these two units. In similar manner, the filter resistor R1 can be placed in other ways than what is shown in the figure, for example in parallel with the inductor L1, in parallel with the series connection of the inductor L1 and the parallel resonance circuit, in series with the inductor L2, etc. Also, as an alternative, several filter resistors may be arranged, placed in different branches of the filter.

The expressions for the dependence of the tuning frequencies on capacitance variations, described above, are based on the assumption that the series and parallel resonance circuits in the filter have the same resonance frequency, i.e. that $$L1.C1 = L2.C2$$

It is, of course, not necessary that the series and parallel resonance circuits have exactly the same tuning frequency. However, according to a preferred embodiment of the invention, the resonance frequencies of the series and parallel resonance circuits are substantially the same.

In the preferred embodiment described above, the main capacitor—the capacitor bank C1—of the shunt filter is designed with plastic film capacitors with a negative temperature coefficient, the capacitor bank C2 being designed with capacitors with a choice of signs of the temperature coefficients, in those cases where the filter is connected to an a.c. power line, has proved to offer economical and practical advantages. The capacitor bank C1, which is totally predominating from the point of view of size and which must be dimensioned so as to be capable of absorbing the fundamental tone component of the line voltage, can then suitably be designed with capacitors which have a plastic film as a dielectric, which offers considerable advantages in the form of lower price, lower losses and smaller physical dimensions. The considerably smaller capacitor bank C2 can then be designed with, for example, impregnated paper as dielectric. However, it is, of course, possible, within the scope of the invention, to choose the capacitor bank C1 instead, so that its capacitance has a positive temperature coefficient and the capacitor C2 so that its capacitance has a negative temperature coefficient. Such an embodiment may be suitable in those cases where the filter equipment is designed for connection to a d.c. power line. The materials for the dielectrics of the capacitors (plastic film and mineral oil impregnated paper, respectively) mentioned above are, of course, only examples and the desired relations between temperature coefficients of the capacitor capacitances may, of course, be obtained with other capacitor embodiments as well.

We claim:

1. Filter equipment for a power line with a double-tuned shunt filter for reduction of voltage or current harmonics which originate from the static convertors connected to the power line, said shunt filter having a series resonance circuit with a first capacitor bank and a first inductor, and a parallel resonance circuit with a second capacitor bank and a second inductor, wherein one of the capacitor banks has a capacitance having a positive temperature coefficient and wherein the other capacitor bank has a capacitance having a negative temperature coefficient.

2. Filter equipment according to claim 1, wherein said series resonance circuit and said parallel resonance circuit have respective resonance frequencies that are substantially equal.

3. Filter equipment according to claim 1, wherein said shunt filter is tuned to two adjacent harmonic frequencies of the power line.

4. Filter equipment according to claim 2, wherein said shunt filter is tuned to two adjacent harmonic frequencies of the power line.

5. Filter equipment according to claim 1, wherein said convertor is connected to an a.c. power line; and
   wherein said shunt filter is tuned to the two frequencies $$f1 = (n.p+1).f0$$

$$f2 = (n.p-1).f0$$

where
   n is an integer greater than or equal to 1;
   p is the pulse number of the convertor; and
   f0 is the fundamental frequency of said a.c. power line.

6. Filter equipment according to claim 2, wherein said convertor is connected to an a.c. power line; and
   wherein said shunt filter is tuned to the two frequencies $$f1 = (n.p+1).f0$$

$$f2 = (n.p-1).f0$$

where
   n is an integer greater than or equal to 1;
   p is the pulse number of the convertor; and
   f0 is the fundamental frequency of said a.c. power line.

7. Filter equipment according to claim 3, wherein said convertor is connected to an a.c. power line; and
   wherein said shunt filter is tuned to the two frequencies $$f1 = (n.p+1).f0$$

$$f2 = (n.p-1).f0$$

where
   n is an integer greater than or equal to 1;

p is the pulse number of the convertor; and f0 is the fundamental frequency of said a.c. power line.

8. Filter equipment according to claim 4, wherein said convertor is connected to an a.c. power line; and wherein said shunt filter is tuned to the two frequencies $$f1 = (n.p + 1).f0$$

$$f2 = (n.p - 1).f0$$

where n is an integer greater than or equal to 1;

p is the pulse number of the convertor; and f0 is the fundamental frequency of said a.c. power line.

9. Filter equipment according to claim 1, and for connection to an a.c. power line, wherein said first capacitor bank has a capacitance having a negative temperature coefficient; and wherein said second capacitor bank has a capacitance having a positive temperature coefficient.

10. Filter equipment according to claim 2, and for connection to an a.c. power line, wherein said first capacitor bank has capacitance having a negative temperature coefficient; and wherein said second capacitor bank has a capacitance having a positive temperature coefficient.

11. Filter equipment according to claim 3, and for connection to an a.c. power line, wherein said first capacitor bank has a capacitance having a negative temperature coefficient; and wherein said second capactior bank has a capacitance having a positive temperature coefficient.

12. Filter equipment according to claim 4, and for connection to an a.c. power line, wherein said first capacitor bank has a capacitance having a negative temperature coefficient; and wherein said second capacitor bank has a capacitance having a positive temperature coefficient.

13. Filter equipment according to claim 5, and for connection to an a.c. power line, wherein said first capacitor bank has a capacitance having a negative temperature coefficient; and wherein said second capacitor bank has a capacitance having a positive temperature coefficient.

14. Filter equipment according to claim 6, and for connection to an a.c. power line, wherein said first capacitor bank has a capacitance having a negative temperature coefficient; and wherein said second capacitor bank has a capacitance having a positive temperature coefficient.

15. Filter equipment according to claim 7, and for connection to an a.c. power line, wherein said first capacitor bank has a capacitance having a negative temperature coefficient; and wherein said second capacitor bank has a capacitance having a positive temperature coefficient.

16. Filter equipment according to claim 8, and for connection to an a.c. power line, wherein said first capacitor bank has a capacitance having a negative temperature coefficient; and wherein said second capacitor bank has a capacitance having a positive temperature coefficient.

17. Filter equipment according to claim 9, wherein said first capacitor bank has capacitors formed with a plastic film as dielectric.

18. Filter equipment according to claim 9, wherein said second capacitor bank has capacitors formed with impregnated paper as dielectric.

19. Filter equipment according to cliam 17, wherein said second capacitor bank has capacitors formed with impregnated paper as dielectric.

* * * * *